(12) United States Patent
Huang et al.

(10) Patent No.: US 8,470,515 B2
(45) Date of Patent: Jun. 25, 2013

(54) METHOD OF FORMING AN ETCH MASK

(75) Inventors: Tse-Yao Huang, Taipei (TW); Yi-Nan Chen, Taipei (TW); Hsien-Wen Liu, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 103 days.

(21) Appl. No.: 13/233,039

(22) Filed: Sep. 15, 2011

(65) Prior Publication Data

US 2013/0071790 A1   Mar. 21, 2013

(51) Int. Cl.
*G03C 5/00* (2006.01)

(52) U.S. Cl.
USPC ............... 430/296; 430/5; 430/326; 430/331; 430/942; 430/945

(58) Field of Classification Search
USPC ...................... 430/5, 296, 331, 942, 945, 326
See application file for complete search history.

(56) References Cited

U.S. PATENT DOCUMENTS 6,383,693 B1 * 5/2002 Wu et al. .......................... 430/5

* cited by examiner

*Primary Examiner* — Christopher Young
(74) *Attorney, Agent, or Firm* — Winston Hsu; Scott Margo

(57) ABSTRACT

A method of forming an etch mask includes: providing a substrate having thereon a material layer to be etched; forming a hard mask layer consisting of a radiation-sensitive, single-layer resist material on the material layer; exposing the hard mask layer to actinic energy to change solvent solubility of exposed regions of the hard mask layer; and subjecting the hard mask layer to water treatment to remove the exposed regions of the hard mask layer, thereby forming a masking pattern consisting of unexposed regions of the hard mask layer.

8 Claims, 8 Drawing Sheets

METHOD OF FORMING AN ETCH MASK

BACKGROUND OF THE INVENTION

1. Field of the Invention

The present invention relates to a method of fabricating an integrated circuit. More particularly, the present invention relates to a method of forming an etch mask using a single-layer resist during the production of a semiconductor integrated circuit device.

2. Description of the Prior Art

During semiconductor wafer processing, features of the semiconductor device are defined by a patterned etch mask. Multi-layer resist has been widely used as the etch mask in the fabrication process of the semiconductor integrated circuit devices. A multi-layer resist typically includes a patterning resist layer such as a photoresist, an interlayer such as a silicon layer and/or a silicon oxynitride layer, and a bottom resist layer such as an amorphous carbon film.

The photoresist is optically patterned according to a desired patterned on a photomask or reticle and then developed to remove the unexposed photoresist in positive lithography or exposed photoresist in negative lithography. The patterned photoresist then serves as a mask for a further step of etching the exposed interlayer and bottom resist layer in order to transfer the pattern from the patterned photoresist into the underlying interlayer and bottom resist layer. Thereafter, the patterned photoresist may be removed. An anisotropic dry etching process is then carried out to etch the material layer not covered by the patterned bottom resist layer to thereby form the circuit features.

However, one drawback of the above-described prior art is the difficulty of controlling critical dimension (CD) of the circuit features. Process variation and CD variation may be introduced during the optical lithographic process and/or during the dry etching process. Therefore, there is still a strong need in this industry to provide an improved method of fabricating an integrated circuit without the aforesaid shortcomings.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY OF THE INVENTION

It is one objective of the present invention to provide an improved method of forming an etch mask using a single-layer resist during the production of a semiconductor integrated circuit device in order to solve the above-mentioned prior art problems.

It is another objective of the present invention to provide an improved method of fabricating an integrated circuit, which is capable of removing the process variation and CD variation introduced during the optical lithographic process and/or during the dry etching process.

According to one embodiment of this invention, a method of forming an etch mask includes: providing a substrate having thereon a material layer to be etched; forming a hard mask layer consisting of a radiation-sensitive, single-layer resist material on the material layer; exposing the hard mask layer to actinic energy to change solvent solubility of exposed regions of the hard mask layer; and subjecting the hard mask layer to water treatment to remove the exposed regions of the hard mask layer, thereby forming a masking pattern consisting of unexposed regions of the hard mask layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
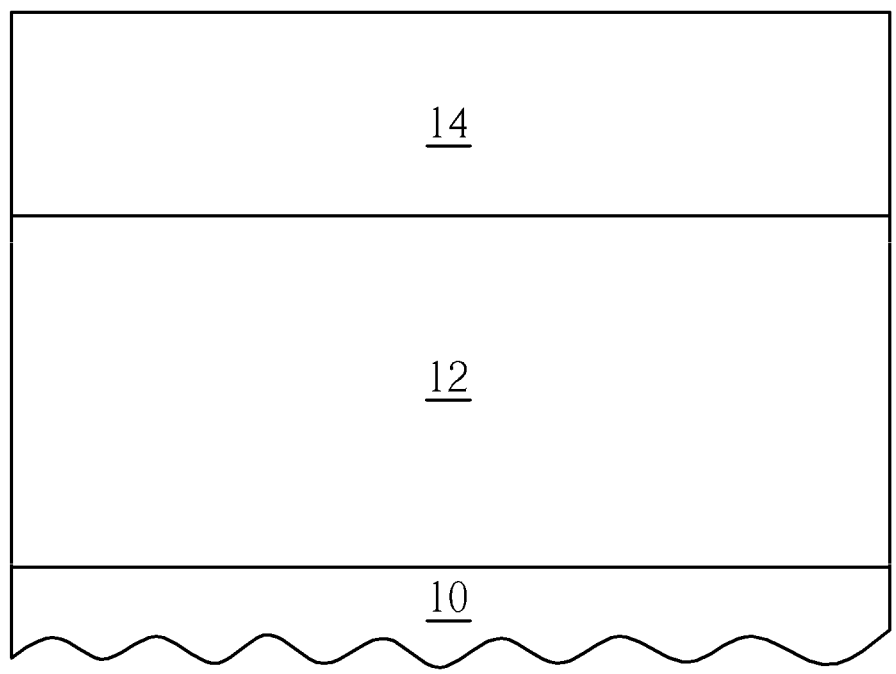
FIG. 1 to FIG. 4 are schematic, cross-sectional diagrams illustrating an exemplary method of forming an etch mask without using photoresist in accordance with one embodiment of this invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description, reference is made to the accompanying drawings, which form a part hereof, and in which is shown by way of illustration specific examples in which the embodiments may be practiced. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

Please refer to FIG. 1 to FIG. 4. FIG. 1 to FIG. 4 are schematic, cross-sectional diagrams illustrating an exemplary method of forming an etch mask in accordance with one embodiment of this invention. As shown in FIG. 1, a substrate 10 having thereon a material layer 12 to be etched is provided. The substrate 10 may be a semiconductor substrate, including, but not limited to, a silicon substrate, a silicon-on-insulator (SOI) substrate, or any substrate comprising semiconductor material. In another embodiment, the substrate 10 may refer to any supporting structure, including, but not limited to, the semiconductor substrates described above. The material layer 12 may be an intrinsic part of the substrate 10, or may be deposited onto a main surface of the substrate 10 in some cases. For example, the material layer 12 may be a polysilicon layer and the substrate 10 may be a silicon substrate.

Still referring to FIG. 1, a hard mask layer 14 comprising a radiation-sensitive, single-layer resist material is formed on the material layer 12. According to the embodiment of this invention, the hard mask layer 14 can be processed to modify its solubility in certain solvents such as water such as pure water or de-ionized water. According to the embodiment of this invention, the hard mask layer 14 may comprise chemical with at least a functional group selected from the group consisting of hydroxyl group and carboxylic group. For example, the hard mask layer 14 may comprise alcohols with one or multiple hydroxyl groups, carboxylic acids, or organic substances comprising both hydroxyl groups and carboxylic groups.

Figure 2:
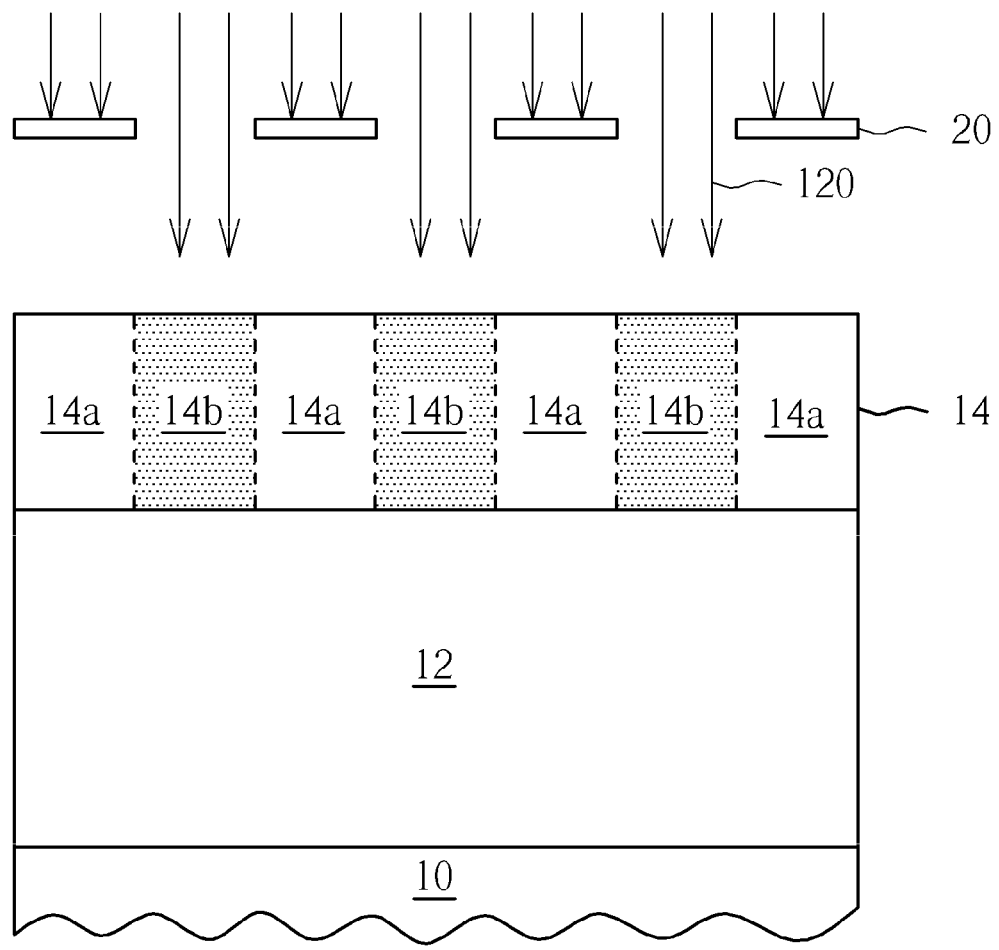

As shown in FIG. 2, an exposure process is performed. Portions of the hard mask layer 14 are exposed to actinic energy 120 through openings in a photomask or reticle 20 to change the solvent solubility of the exposed regions 14b. At this point, according to the embodiment of this invention, the unexposed regions 14a are substantially not soluble in water. The aforesaid actinic energy 120 may include but not limited to e-beam or laser, which is able to cause photochemical reactions in the exposed regions 14b of the hard mask layer 14 to make these regions be soluble in water.

Figure 3:
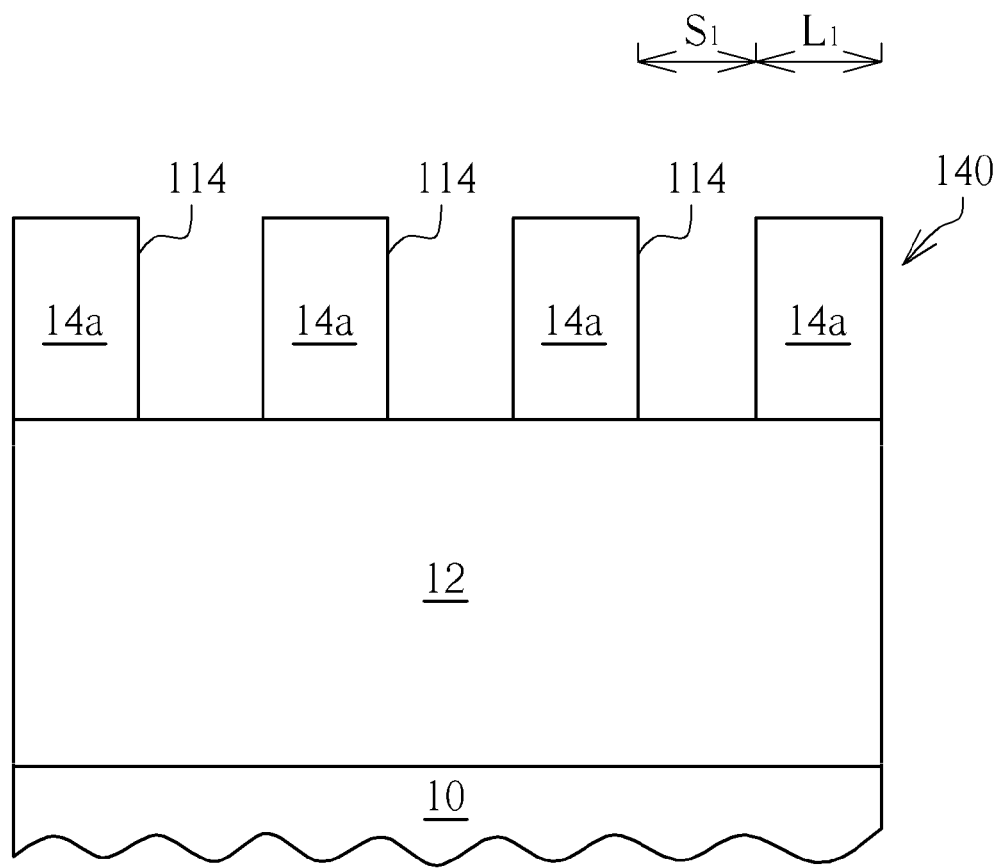

As shown in FIG. 3, after the exposure process in FIG. 2, the exposed regions 14b are removed to expose portions of the material layer 12 to be etched. According to the embodiment of this invention, the hard mask 14 treated by actinic energy such as e-beam or laser is subjected to water treatment. Since the exposed regions 14b are soluble in water, the exposed regions 14b can be readily removed by dipping the wafer in water or by spinning methods, thereby forming openings 114 between the unexposed regions 14a. After removing the exposed regions 14b, a masking pattern 140 consisting of the unexposed regions 14a is formed on the material layer 12 to be etched. For example, the masking pattern 140 may be repeated equal line/space pattern with a line width L1 of about 10 nm-several hundreds nm and a width of the space S1 of about 10 nm-several hundreds nm. The line width L1 (or the space S1) may be equal to or smaller than the resolution limit of an exposure tool.

Figure 4:
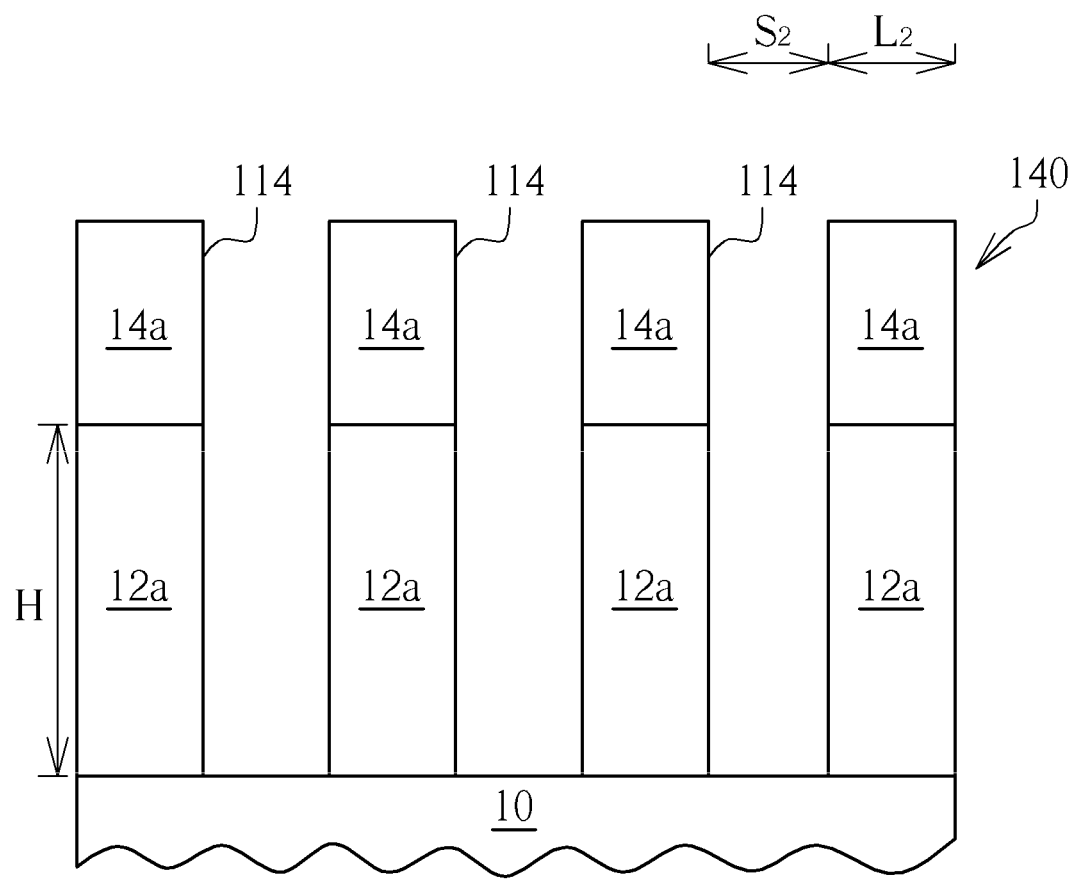

As shown in FIG. 4, after the water treatment in FIG. 3, a dry etching process is performed. The exposed portions of the material layer 12 are etched through the openings 114, thereby forming features 12a such as repeated equal line/space feature pattern having a line width L2 of about 10 nm-several hundreds nm and a width of the space S2 of about 10 nm-several hundreds nm. Likewise, the line width L2 (or the space S2) may be equal to or smaller than the resolution limit of an exposure tool. Each of the features 12a may have a aspect ratio=L2/H.

Figure 5:
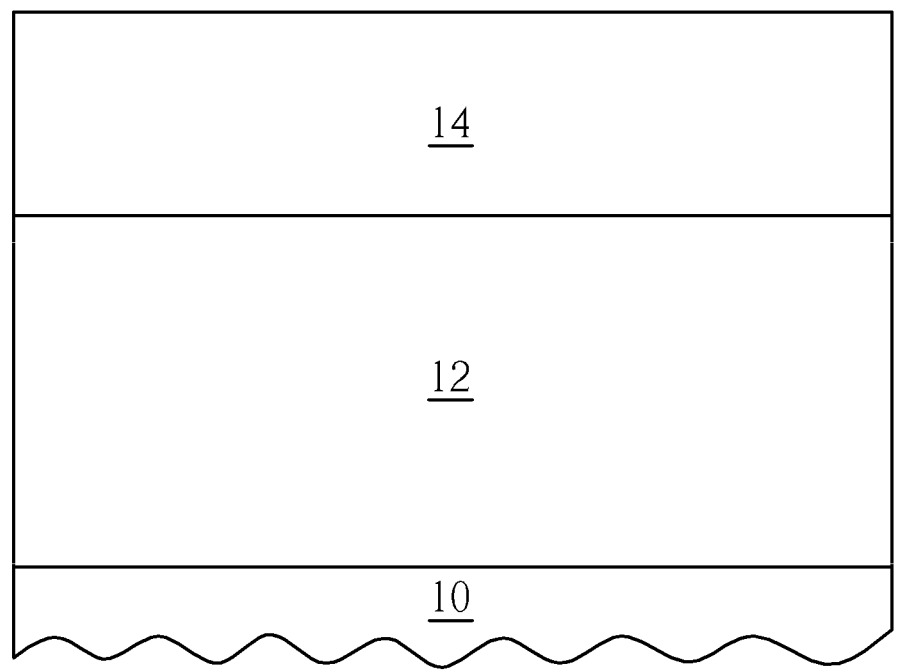
FIG. 5 to FIG. 8 are schematic, cross-sectional diagrams illustrating an exemplary method of forming an etch mask involving the use of photoresist in accordance with another embodiment of this invention.

Please refer to FIG. 5 to FIG. 8. FIG. 5 to FIG. 8 are schematic, cross-sectional diagrams illustrating an exemplary method of forming an etch mask in accordance with another embodiment of this invention. As shown in FIG. 5, likewise, a substrate 10 having thereon a material layer 12 to be etched is provided. The substrate 10 may be a semiconductor substrate, including, but not limited to, a silicon substrate, an SOI substrate, or any substrate comprising semiconductor material. In another embodiment, the substrate 10 may refer to any supporting structure, including, but not limited to, the semiconductor substrates described above. The material layer 12 may be an intrinsic part of the substrate 10, or may be deposited onto a main surface of the substrate 10 in some cases. For example, the material layer 12 may be a polysilicon layer and the substrate 10 may be a silicon substrate. A hard mask layer 14 comprising a radiation-sensitive, single-layer resist material is formed on the material layer 12. According to the embodiment of this invention, the hard mask layer 14 can be processed to modify its solubility in certain solvents such as water such as pure water or de-ionized water. According to the embodiment of this invention, the hard mask layer 14 may comprise chemical with at least a functional group selected from the group consisting of hydroxyl group and carboxylic group. For example, the hard mask layer 14 may comprise alcohols with one or multiple hydroxyl groups, carboxylic acids, or organic substances comprising both hydroxyl groups and carboxylic groups.

Figure 6:
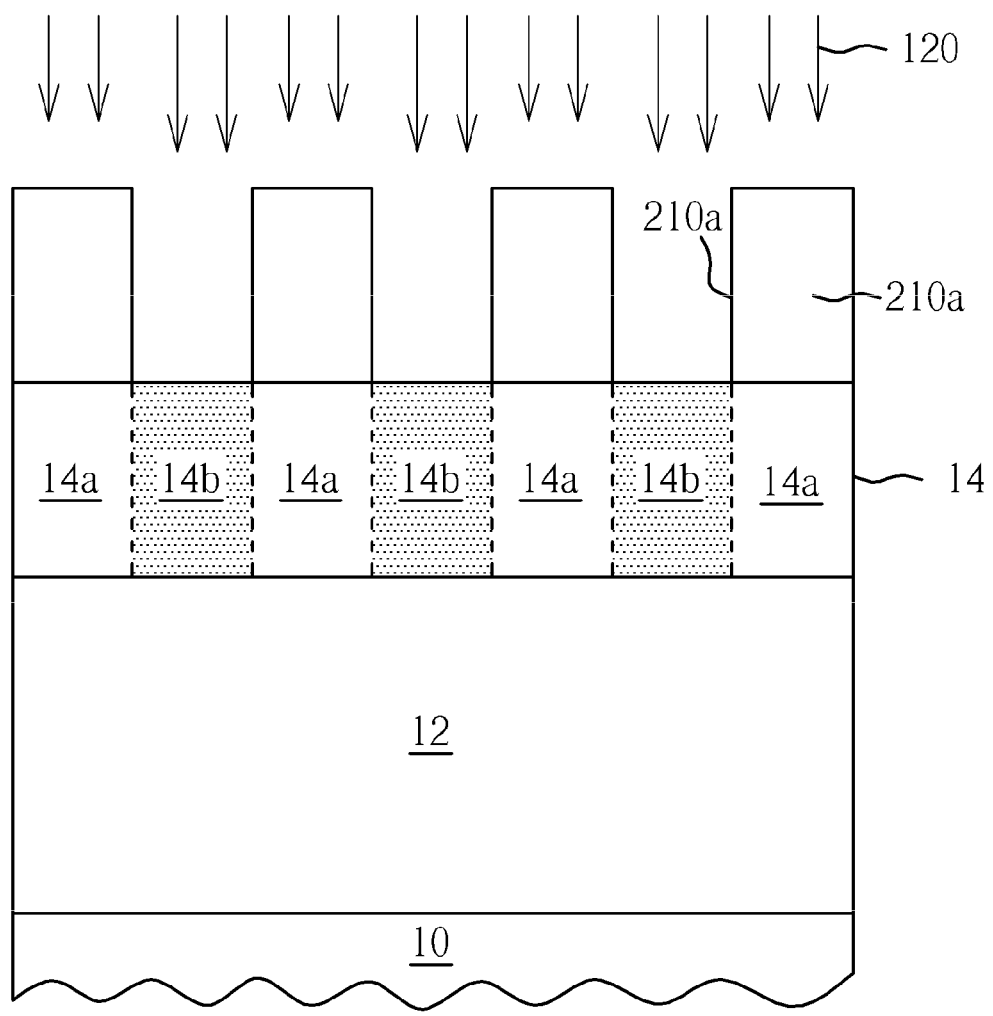

As shown in FIG. 6, a patterned photoresist 210 is then formed on the hard mask layer 14. The method for forming the patterned photoresist 210 is known in the art, and the detailed steps are therefore omitted. Subsequently, an exposure process is performed. Portions of the hard mask layer 14 not masked by the patterned photoresist 210 are exposed to actinic energy 120 through openings in the patterned photoresist 210 to change the solvent solubility of the exposed regions 14b. At this point, according to the embodiment of this invention, the unexposed regions 14a are substantially not soluble in water. The aforesaid actinic energy 120 may include but not limited to e-beam or laser, which is able to cause photochemical reactions in the exposed regions 14b of the hard mask layer 14 to make these regions be soluble in water. Thereafter, the patterned photoresist 210 is removed using method known in the art, for example, ashing.

Figure 7:
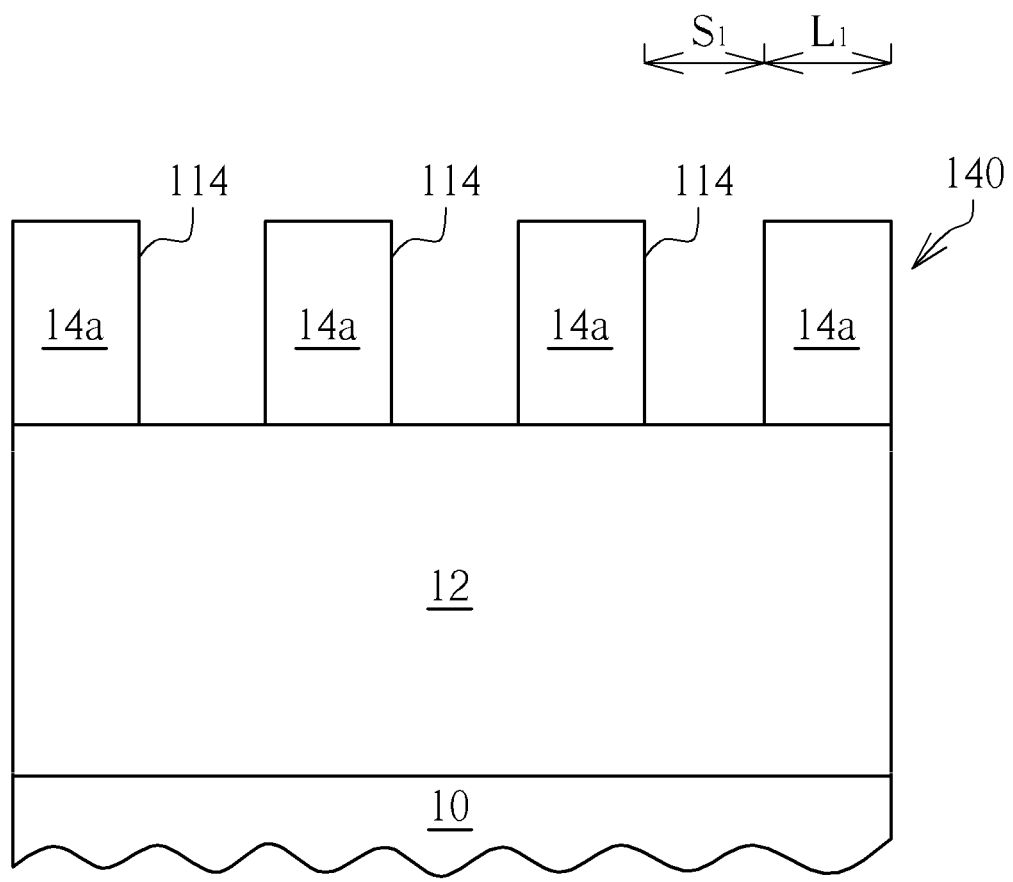

As shown in FIG. 7, after the exposure process, the exposed regions 14b are removed to expose portions of the material layer 12 to be etched. According to the embodiment of this invention, the hard mask 14 treated by actinic energy such as e-beam or laser is subjected to water treatment. Since the exposed regions 14b are soluble in water, the exposed regions 14b can be readily removed by dipping the wafer in water or by spinning methods, thereby forming openings 114 between the unexposed regions 14a. After removing the exposed regions 14b, a masking pattern 140 consisting of the unexposed regions 14a is formed on the material layer 12 to be etched. For example, the masking pattern 140 may be repeated equal line/space pattern with a line width L1 of about 10 nm-several hundreds nm and a width of the space S1 of about 10 nm-several hundreds nm. The line width L1 (or the space S1) may be equal to or smaller than the resolution limit of an exposure tool.

Figure 8:
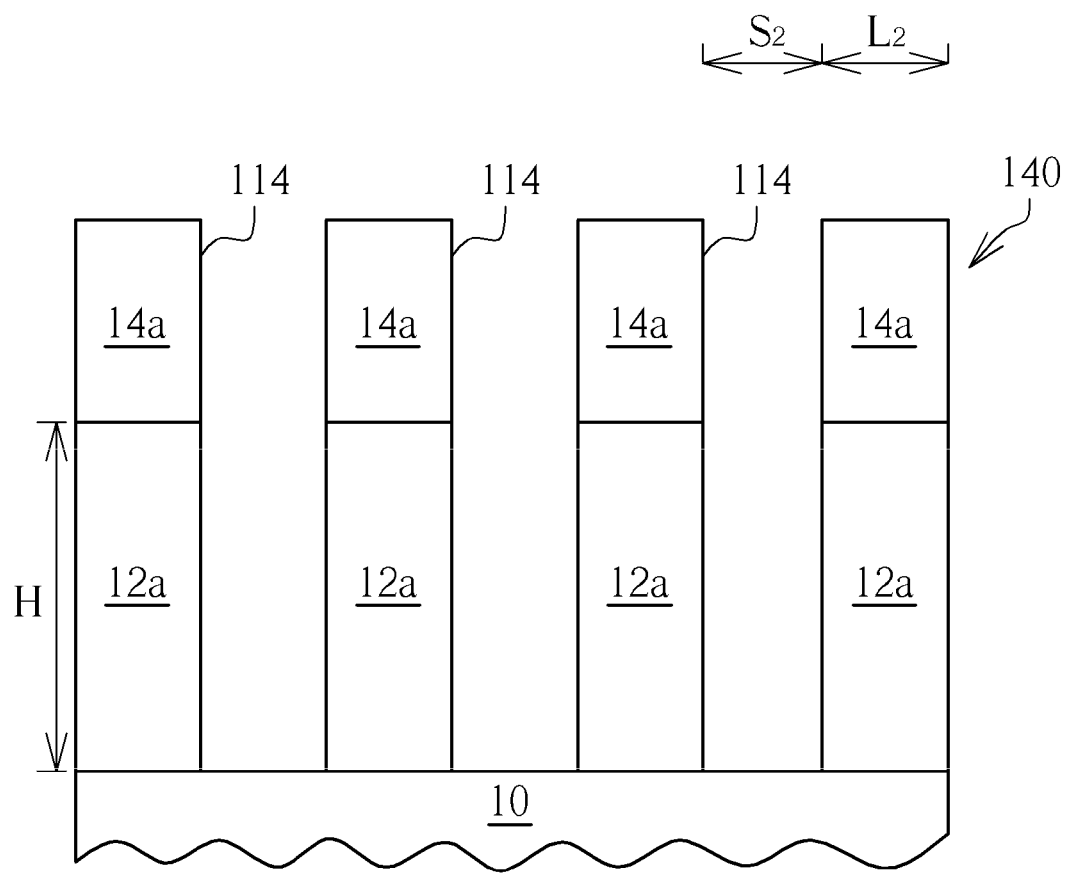

As shown in FIG. 8, after the water treatment in FIG. 7, a dry etching process is performed. The exposed portions of the material layer 12 are etched through the openings 114, thereby forming features 12a such as repeated equal line/space feature pattern having a line width L2 of about 10 nm-several hundreds nm and a width of the space S2 of about 10 nm-several hundreds nm. Likewise, the line width L2 (or the space S2) may be equal to or smaller than the resolution limit of an exposure tool.

Those skilled in the art will readily observe that numerous modifications and alterations of the device and method may be made while retaining the teachings of the invention.

What is claimed is:

1. A method of forming an etch mask, comprising:
   providing a substrate having thereon a material layer to be etched;
   forming a hard mask layer consisting of a radiation-sensitive, single-layer resist material on the material layer;
   exposing the hard mask layer to actinic energy to change solvent solubility of exposed regions of the hard mask layer, wherein the exposed regions of the hard mask layer are soluble in pure water; and
   subjecting the hard mask layer to water treatment to remove the exposed regions of the hard mask layer, thereby forming a masking pattern consisting of unexposed regions of the hard mask layer.

2. The method of forming an etch mask according to claim 1 wherein the hard mask layer comprises chemical with at least a functional group selected from the group consisting of hydroxyl group and carboxylic group.

3. The method of forming an etch mask according to claim 1 wherein prior to exposing the hard mask layer to actinic energy, the method further comprising:
   forming a patterned photoresist on the hard mask layer.

4. The method of forming an etch mask according to claim 3 wherein after exposing the hard mask layer to actinic energy, the method further comprising:
  removing the patterned photoresist.

5. The method of forming an etch mask according to claim 1 wherein actinic energy comprise e-beam or laser.

6. The method of forming an etch mask according to claim 1 wherein the material layer is an intrinsic part of the substrate.

7. The method of forming an etch mask according to claim 1 wherein the material layer is deposited onto a main surface of the substrate.

8. A method of forming an etch mask, comprising:
  providing a substrate having thereon a material layer to be etched;
  forming a hard mask layer consisting of a radiation-sensitive, single-layer resist material on the material layer;
  forming a photoresist pattern on the hard mask layer, wherein the photoresist pattern defines exposed regions of the hard mask layer;
  subjecting the exposed regions of the hard mask layer to actinic energy, thereby changing solubility of the exposed regions of the hard mask layer;
  removing the photoresist pattern; and
  removing the exposed regions of the hard mask layer by using water.

* * * * *